(12) United States Patent
Hsieh

(10) Patent No.: US 12,317,628 B2
(45) Date of Patent: May 27, 2025

(54) IMAGE SENSOR PACKAGE

(71) Applicant: SEMICONDUCTOR COMPONENTS INDUSTRIES, LLC, Phoenix, AZ (US)

(72) Inventor: Yu-Te Hsieh, Taoyuan (TW)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 454 days.

(21) Appl. No.: 17/659,901

(22) Filed: Apr. 20, 2022

(65) Prior Publication Data

US 2023/0343806 A1 Oct. 26, 2023

(51) Int. Cl.
*H10D 84/80* (2025.01)
*H10F 39/00* (2025.01)
*H10F 39/18* (2025.01)

(52) U.S. Cl.
CPC .......... *H10F 39/811* (2025.01); *H10F 39/011* (2025.01); *H10F 39/18* (2025.01); *H10F 39/804* (2025.01); *H10F 39/8063* (2025.01)

(58) Field of Classification Search
CPC ......... H01L 27/14627; H01L 27/14618; H01L 27/14636; H01L 27/14643; H01L 27/1469; H01L 27/14689; H10F 38/811
See application file for complete search history.

(56) References Cited

U.S. PATENT DOCUMENTS

| | | | | |
|---|---|---|---|---|
| 6,492,726 B1* | 12/2002 | Quek | .................. | H01L 25/0657 257/E23.19 |
| 6,555,414 B1* | 4/2003 | Vanfleteren | ............. | H01L 24/29 257/E21.503 |
| 2007/0152345 A1* | 7/2007 | Wu | ..................... | H01L 25/0657 257/777 |
| 2009/0267170 A1* | 10/2009 | Chien | ............... | H01L 27/14618 257/434 |
| 2010/0310137 A1 | 12/2010 | Chou et al. | | |
| 2013/0221470 A1 | 8/2013 | Kinsman et al. | | |
| 2016/0090298 A1* | 3/2016 | Sengupta | .............. | B81B 7/0048 438/51 |
| 2017/0256576 A1* | 9/2017 | Hsieh | ................ | H01L 27/14643 |
| 2020/0321375 A1* | 10/2020 | Wu | ................... | H01L 27/14634 |

* cited by examiner

*Primary Examiner* — Walter H Swanson
*Assistant Examiner* — Jacob T Nelson
(74) *Attorney, Agent, or Firm* — Brake Hughes Bellermann LLP

(57) ABSTRACT

A method includes disposing a first die on a first die-receiving surface in a first cavity at a first vertical height in a substrate and disposing a second die on a second die-receiving surface in a second cavity at a second vertical height in the substrate. The second cavity has an open top, and the second vertical height is greater than the first vertical height in the substrate.

21 Claims, 8 Drawing Sheets

IMAGE SENSOR PACKAGE

TECHNICAL FIELD

This description relates to packaging of semiconductor image sensors.

BACKGROUND

Digital image sensors (e.g., a complementary metal-oxide-semiconductor image sensor (CIS) or a charge-coupled device (CCD)) are typically packaged as single die in an integrated circuit (IC) package (i.e., a ceramic ball grid array package (CB GA) or a plastic ball grid array (PBGA) package. However, newer applications (e.g., automotive applications such as advanced driver assistance systems (ADAS) and autonomous driving (AD) systems) need other circuitry (e.g., image signal processor (ISP) or ASIC die) to be included in the same IC package as the CIS die for improved imaging performance.

SUMMARY

In a general aspect, a package includes a substrate having a first cavity at a first vertical height from a bottom surface of the substrate and a second cavity at a second vertical height greater than the first vertical height from the bottom surface of the substrate. An integrated circuit die is disposed in the first cavity, a digital image sensor die is disposed in the second cavity, and a transparent cover disposed at a top of the substrate over the second cavity.

In a general aspect, a package includes a substrate having a first cavity underneath a second cavity. The second cavity has an open top at a top surface of the substrate. An integrated circuit die is disposed in the first cavity, a complementary metal-oxide-semiconductor image sensor (CIS) die is disposed in the second cavity, and a transparent cover disposed on the top surface of the substrate covering the open top of the second cavity.

In a general aspect, a method includes disposing a first die on a first die-receiving surface in a first cavity at a first vertical height in a substrate and disposing a second die on a second die-receiving surface in a second cavity at a second vertical height in the substrate. The second cavity has an open top, and the second vertical height is greater than the first vertical height in the substrate.

The details of one or more implementations are set forth in the accompanying drawings and the description below. Other features will be apparent from the description and drawings, and from the claims.

DETAILED DESCRIPTION

This disclosure describes multi-die image sensor packages and methods for fabricating the multi-die image sensor packages. An example multi-die image sensor package may, for example, include a digital image sensor die (e.g., complementary metal-oxide-semiconductor image sensor (CIS) die) and an associated transparent window, cover, or lid, and at least one image signal processor (ISP) die, or an application-specific integrated circuit ASIC die.

In example implementations, a multi-die-sensor image package may include an ISP, or an ASIC die disposed at a first vertical height in a package substrate, and a CIS die disposed at a second vertical height above the ISP or ASIC die disposed at the first vertical height in the package substrate.

Figure 1A:
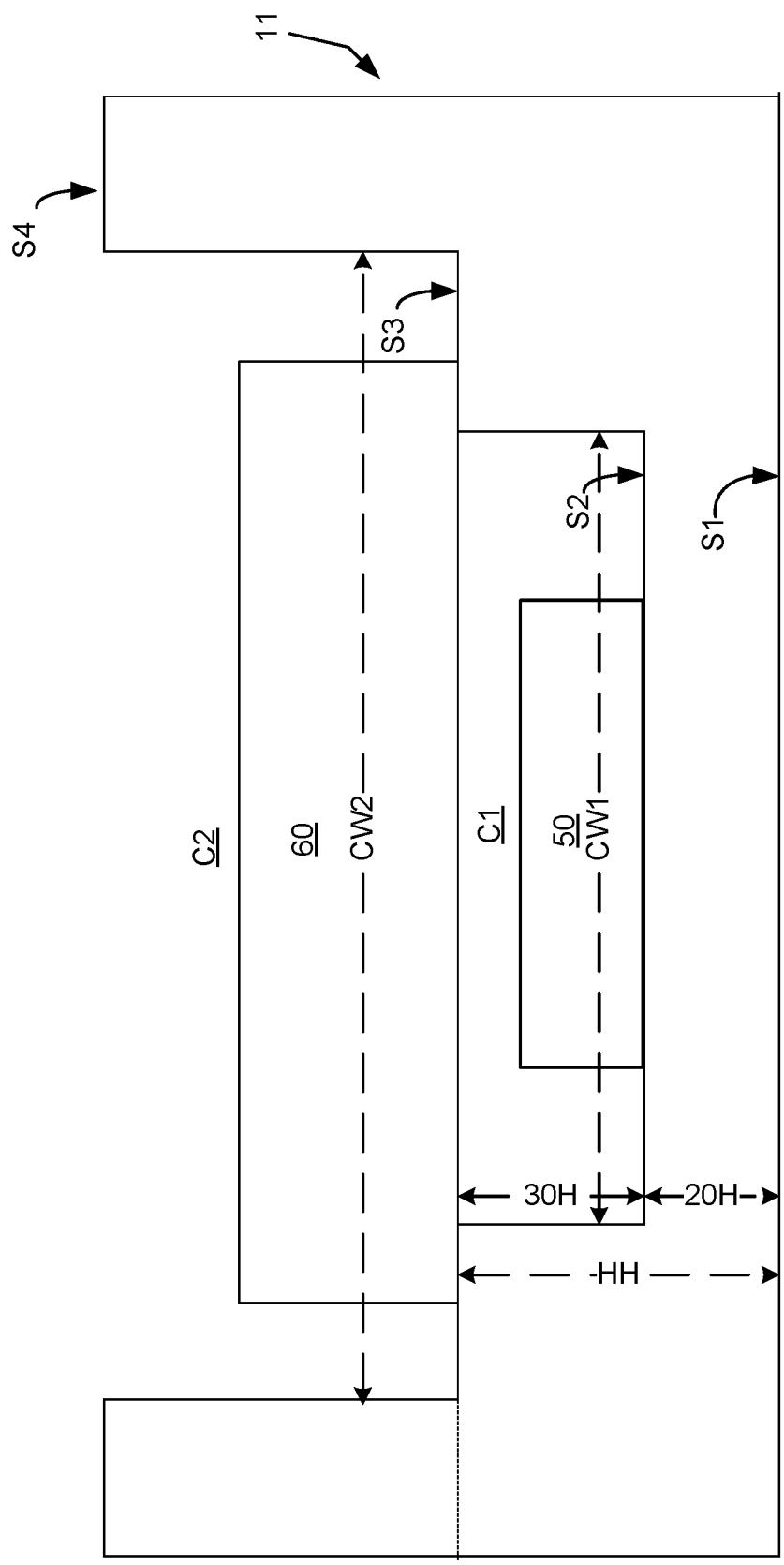
FIG. 1A schematically illustrates a concept of disposing a first die vertically above a second die in a package substrate.

FIG. 1A schematically illustrates a concept of disposing a CIS die vertically above the ISP or ASIC die in a package substrate.

As shown in FIG. 1A, a package substrate (e.g., substrate 11) may have a bottom surface S1 and a top surface S4. Two cavities C1 and C2 having horizontal widths CW1 and CW2, respectively, are formed in substrate 11 with cavity C2 being disposed vertically above cavity C1 (in the z direction). Width CW2 of cavity C2 may be larger than width CW1 of cavity C1. Cavity C1 is formed in substrate 11 between a bottom surface S2 and a top surface S3. in substrate 11. Cavity C2 is formed in substrate 11 between the top surface S3 of cavity C1 and the top surface S4 of substrate 11. The ISP or ASIC die (e.g., ASIC 50) is disposed in cavity C1 on bottom surface S3 at the first vertical height 20H above the bottom surface S1 of the package substrate. The CIS die (e.g., CIS 60) is disposed in cavity C2 on top surface S3 of cavity C1 at a vertical height 30H above the bottom surface S2 of cavity C1, in other words, CIS 60 is disposed at the second vertical height HH (=20H+30H) above the bottom surface S1 of the package substrate. The second vertical height HH is greater than first vertical height 20H.

This vertical stack arrangement of the dies in the package substrate reduces the cross-sectional area footprint of the multi-die package compared to the footprint of the multi-die packages in which the dies are horizontally spaced apart.

In example implementations, the multi-die image sensor packages may be fabricated using substrates made of insulating dielectric material layers including, for example, layers of ceramic material, flame retardant epoxies (e.g., FR4 or FR5), bismaleimide triazine (BT) epoxy, molding compounds, or other epoxies, or combinations thereof.

In example implementations, a multi-die package substrate may be made (e.g., by a lay-up process) as a series or a stack of laid-up layers of the insulating dielectric materials (e.g., ceramic material) interleaved with conductive layers. The conductive layers may, for example, include wiring (e.g., conductive traces, pads, and planes) for electrical connections to the dies in the package. The conductive traces, pads, and planes may be formed of, for example, tungsten, or copper plated with nickel or silver. The disclosed substrates are not limited to any particular number of ceramic or conductive layers, nor are they limited to any particular materials or thicknesses.

Further, in example implementations, the multi-die package substrate may include a dam structure (e.g., a parapetlike wall) built on the outer edges of a top surface of the stack of the laid-up layers of the insulating dielectric materials.

In example implementations, a multi-die image sensor package may include different dies (e.g., CIS die, ISP die, ASIC die, etc.) disposed at different vertical levels or heights in a substrate. The substrate may, for example, include different cavities formed on surfaces at different vertical heights or levels in the substrate. The bottom surfaces of the cavities may be configured to be die-receiving surfaces on which the dies can be placed and attached or bonded to the surfaces. An ASIC or ISP die may, for example, be disposed on a first die-receiving surface in a first cavity formed in the substrate at a first vertical height from a bottom of the substrate, and the CIS die may be disposed on a second die-receiving surface in a second cavity formed in the substrate at a second vertical height from the bottom of the substrate. The second vertical height of the second die-receiving surface (in the second cavity) may be at a higher height than the first vertical height of first die-receiving surface (in the first cavity) from the bottom of the substrate. The ASIC (or ISP) die disposed on the first die-receiving surface in a first cavity may be encapsulated in an encapsulant (e.g., epoxy).

In example implementations, the first cavity may open up into the second cavity through a bottom portion or surface of the second cavity. The second cavity may be open (have an open top) to the exterior of the substrate at a top of the substrate. In example implementations, the first cavity may have a smaller cross-sectional area than a cross sectional area of the larger (wider) second cavity. For example, the first cavity may have a narrower width than a width of the second cavity. An inner vertical sidewall of the first cavity and an inner vertical sidewall of the second wider cavity may have a staircase-like contour with a horizontal shelf or step along the bottom portion or surface of the second cavity (between the inner vertical sidewalls of the first cavity and the second cavity). The second cavity may be open to the exterior of the substrate at a top of the substrate.

In example implementations, the second cavity may be defined by the top surface of the stack of laid-up layers of the insulating dielectric material and the inner vertical sidewalls of the dam structure built on the outer edges of the top surface of the stack. In example implementations, the multi-die image sensor package may include a transparent cover or lid placed on top of the dam structure walls to extend over the top of the substrate and enclose the second cavity in which the CIS is disposed. The transparent cover or lid may be made of any transparent material (e.g., glass, plastics, etc.). In example implementations, the transparent cover or lid may be a glass cover or lid. The glass cover or lid may be attached to the top of the walls of the dam structure using, for example, an adhesive. In example implementations, the glass cover or lid may seal the CIS in a gaseous atmosphere (e.g., air or other gases) in the second cavity. The glass cover or lid may be transparent to light (e.g., visible light) directed to the CIS for imaging.

Figure 1B:
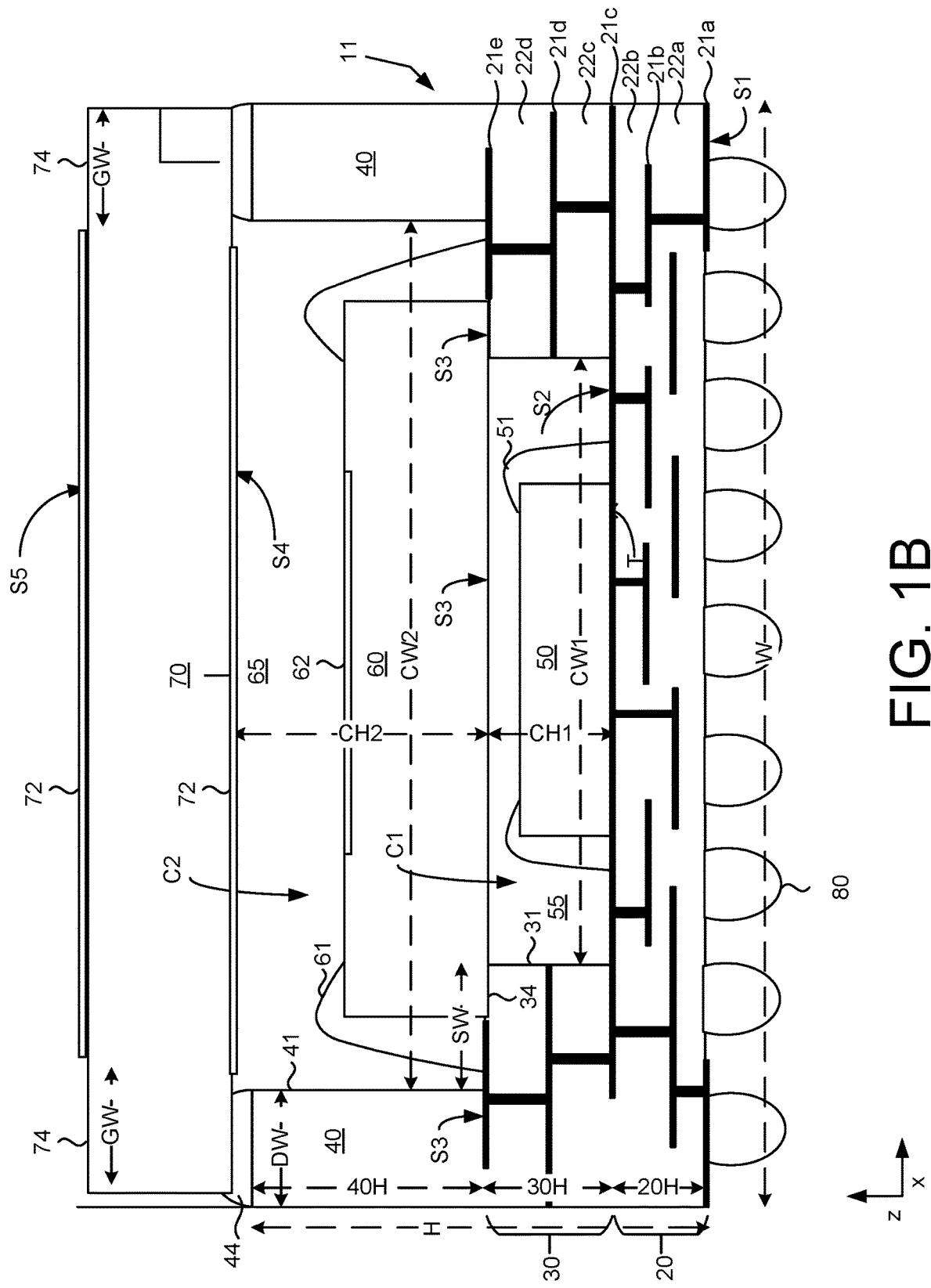
FIG. 1B illustrates an example multi-die image sensor package.

FIG. 1B shows a cross sectional view (in a z-x plane) of an example multi-die image sensor package 10, in accordance with the principles of the present disclosure. FIG. 1B is a more detailed implementation of the FIG. 1A.

Example multi-die image sensor package 10 may include an ASIC chip (e.g., ASIC 50) and a CIS (e.g., CIS 60) disposed in die-receiving cavities (e.g., cavities C1 and C2, respectively) that are formed in a package substrate (e.g., substrate 11). In substrate 11, cavity C1 is underneath or below cavity C2 in the vertical direction (along the z axis).

Substrate 11 may be a multi-layer substrate made, for example, of a stack of dielectric insulating material layers (e.g., layers of ceramic material, flame retardant epoxies (e.g., FR4 or FR5), bismaleimide triazine (BT) epoxy, molding compounds. etc.) layers interleaved with conductive layers (conductive traces, pads, and planes) for wiring. The conductive layers may, for example, include tungsten, or copper plated with nickel or silver. For example, as shown in FIG. 1A, substrate 11 may include substrate layer stack 20 (of vertical height 20H) and substrate layer stack 30 (of vertical height 30H) that include dielectric insulator (e.g., ceramic) layers 22a, 22b, 22c, and 22d) interleaved with conductive layers 21a, 21b, 21c, 21d and 21e) in a vertical direction (z axis direction) between a bottom surface (e.g., surface S1) and an intermediate surface (e.g., surface S3) of substrate 11. Conductive layers 21a, 21b, 21c, 21d and 21e may be electrically interconnected by vertical vias and can be used as signal redistribution layers for electrical interconnections within substrate 11 and external to substrate 11.

Substrate 11 also includes a dam (e.g., dam 40) with a vertical wall height 40H built on outer edges of substrate layer stack 30. Dam 40 may have inner vertical sidewalls 41 facing the interior of substrate 11. The tops of the vertical walls of dam 40 may have a width DW. Dam 40 may be made, for example, of ceramic material, mold materials, or epoxies such as FR4, FR5 or BT epoxies.

Substrate 11 may have a width W (in the x-direction) and a height H (in the Z direction), which may be about equal to the sum of the heights of substrate layer stacks 20 and 30 and the height of dam 40 (i.e., H≈20H+30H+40H).

In substrate 11, a first cavity C1 is formed, for example, in substrate layer stack 30 by removing or cutting out a portion of substrate layer stack 30 material in an area above a top surface (e.g., surface S2) of substrate layer stack 20 (in other words, by making a hole in substrate layer stack 30). First cavity C1 may have a width CW1 (in the x direction) and a cavity height CH1 (in the z direction). Width CW1 may be smaller than width W of substrate 11. Cavity height CH1 may be about the same, or about the same, as the height 30H of substrate layer stack 30. A bottom surface of cavity C1 may be the same as the top surface (e.g., surface S2) of substrate layer stack 20, and form a die-receiving surface of cavity C1 (e.g., for receiving an ASIC or ISP die).

An inner vertical sidewall (e.g., sidewall 31) of the cavity C1 and an inner vertical sidewall 41 of dam 40 may have a staircase-like contour with a horizontal shelf or step 34 extending (e.g., in the x direction) along a top surface (e.g., surface S3) of substrate layer stack 30. The horizontal shelf or step 34 may, for example, have a width SW (in the x direction). In some implementations, cavity C1 is filled with an encapsulant (e.g., an epoxy 55) up to cavity height CH1 to encapsulate a die in the cavity. In such implementations, top surface S3 of cavity C1 may be coextensive with a top surface of the encapsulant filing cavity C1.

Further, in substrate 11, a second cavity C2 is formed or defined by the volume surrounded by inside walls 41 of dam 40 above the top surface (e.g., surface S3) of substrate layer stack 30. Cavity C2 may have a bottom surface that is coextensive with the top surface (e.g., surface S3) of cavity C1 over width CW1 of cavity C1 and may further include the horizontal shelf or step 34 having a width SW (in the x direction). The bottom surface of cavity C2 and the top surface of cavity C1 are both referred to herein as surface S3.

Cavity C2 has an open top above the height of the walls (e.g., walls 41) of dam 40 (e.g., at about the top of substrate 11, surface S4). A transparent window (e.g., glass cover 70)

extending over substrate 11 may be placed on top of the walls of dam 40 to enclose cavity C2.

In example implementations of multi-die image sensor package 10, an ASIC or ISP die (e.g., ASIC 50) may be positioned in cavity C1 on the die-receiving surface (e.g., surface S2) of cavity C1 (in other words, ASIC 50 may be surface mounted on the die-receiving surface S2). In example implementations, ASIC 50 may be die bonded to the substrate (i.e., surface S2) using, for example, a layer of a die bonding adhesive or epoxy (not shown) to bond a bottom surface of ASIC 50 to the die-receiving surface (e.g., surface S2). Further, for electrical interconnections to ASIC 50, wire bonds (e.g., wire bond 51) may be made between conductive pads (e.g., aluminum pads) (not shown) on a top surface of ASIC 50 and traces or pads on a conductive layer (e.g., conductive layer 21c) at surface S2 in substrate 11. Die-bonded and wire-bonded ASIC 50 may be referred to herein as a surface mounted die (in contrast to a flip-chip mounted die, discussed later herein with reference to FIG. 2)).

Further, an encapsulant (e.g., epoxy 55) may fill cavity C1 up to surface S3 (e.g., up to cavity height CH1) such that the surface mounted ASIC 50 is encapsulated in cavity C1. A top surface of epoxy 55 filling cavity C1 may be coextensive with the top surface (e.g., surface S3) of cavity C1.

Further, in the example implementations of multi-die image sensor package 10, an image sensor (e.g., CIS 60) may be placed on the die-receiving surface (e.g., surface S3) in cavity C2. As shown in FIG. 1B, CIS 60 may be placed directly above cavity C1 (which may be filled with epoxy 55 encapsulating ASIC 50). CIS 60 may be oriented so that a micro lens or filter assembly (e.g., assembly 62) on CIS 60 is facing upward (in the z direction) toward a transparent cover (e.g., glass cover 70) placed on top of the walls of dam 40. Glass cover 70, which encloses cavity C2 from above (i.e., from the top), may be attached to the top of the walls of dam 40 using an adhesive (e.g., epoxy 64)(e.g., epoxy 44).

In example implementations, CIS 60 may be die bonded to the substrate (i.e., surface S3) using, for example, a layer of die bonding adhesive or epoxy (not shown) to bond a bottom surface of CIS 60 to surface S3. CIS 60 disposed in cavity C2 may be isolated from ASIC 50 disposed vertically below in cavity C1 by epoxy 55, which fills cavity C1 and encapsulates ASIC 50. Further, for electrical interconnections to CIS 60, wire bonds (e.g., wire bond 61) may be made between conductive pads (e.g., aluminum pads) (not shown) on a top surface of CIS 60 and traces or pads of a conductive layer (e.g., conductive layer 21e) at surface S3 in substrate 11.

Glass cover 70, which encloses cavity C2 from above, may be attached to the top of the walls of dam 40 using an adhesive (e.g., epoxy 44). Glass cover 70 may be transparent at the operational wavelengths (e.g., visible light) used by CIS 60 for imaging. In example implementations, one or both sides of glass cover 70 may be coated with broad band anti-reflective (BBAR) coating (e.g., BBAR 72) to increase, for example, transmission of visible light through glass cover 70 to CIS 60. In some implementations, the BBAR coating may not extend to the edges of glass cover 70. In some example implementations, as shown in FIG. 1B, an edge strip 74 at the edges of glass cover 70 may not be coated with an anti-reflective coating (i.e., edge strip 74 may be without any BBAR coating).

Figure 3A:
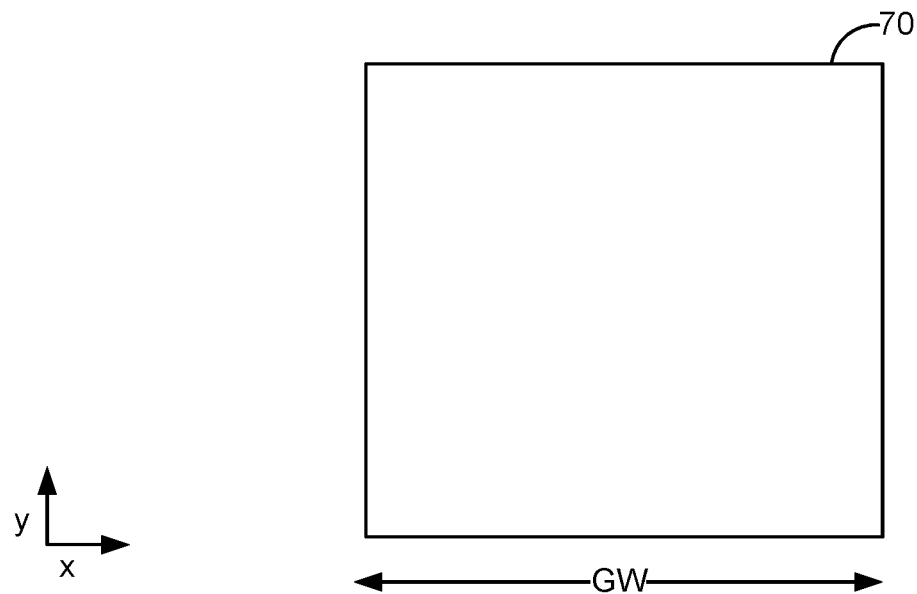
FIG. 3A illustrates an example glass cover.
Figure 3B:
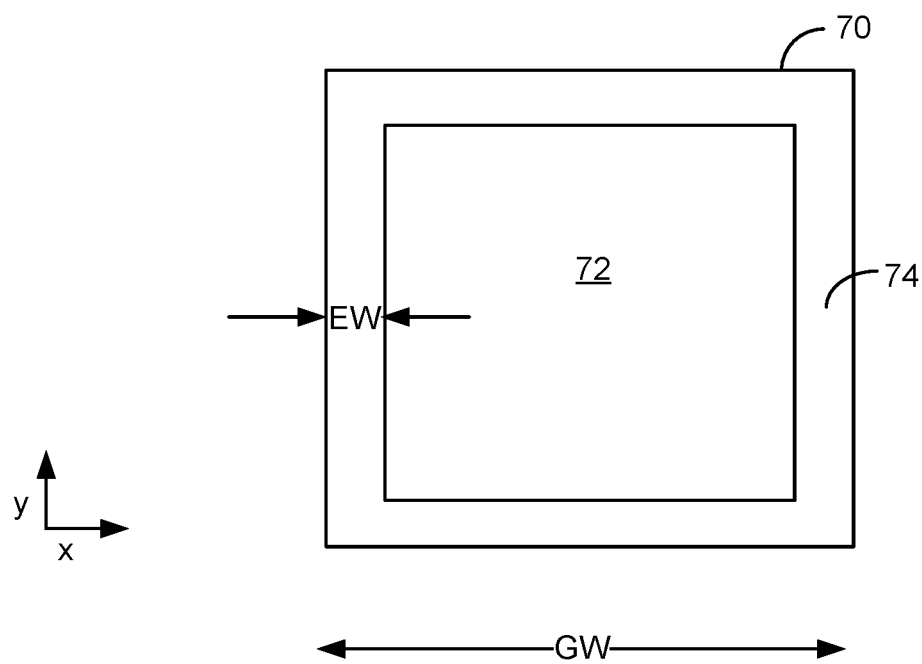
FIG. 3B illustrates an example anti-reflective coated area on a glass cover.

FIG. 3A shows a plan view of, for example, a square glass cover 70 having a side width GW. FIG. 3B shows, for example, a BBAR coating (e.g., BBAR 72) applied to the square glass cover 70, which does not extend to the edges and leaves edge strip 74 of the square glass cover 70 uncoated. Edge strip 74 may have a width EW that is comparable to the width DW of the top of the walls of dam 40 (FIG. 1B). Uncoated edge strip 74 may allow ultraviolet light to pass through the glass cover to help in curing epoxy 44 that is used attach glass cover 70 to the top of dam 40.

With renewed reference to FIG. 1B, glass cover 70 attached to the top of dam 40 may enclose cavity C2 and seal CIS 60 disposed in cavity C2 in a gaseous atmosphere (e.g., atmosphere 65) of air or other gases.

Further, in the example implementations of multi-die image sensor package 10, for external electrical connections (e.g., for pin out), bottom surface S1 of substrate 11 may, for example, have brazed pins (not shown) or solder bumps 80 connected, for example, to pads or traces on conductive layer 21a. Solder bumps 80 disposed on bottom surface S1 of substrate 11 can be used, for example, for a solder ball mount of package 11 on a PCB board (not shown) for pin out.

In the example multi-die image sensor package 10 shown in FIG. 1B, ASIC 50 is surface mounted in cavity C1 (i.e., die-bonded and wire bonded on die-receiving surface S2 in cavity C1). In some other example implementations of the multi-die image sensor packages, ASIC 50 may be flip-chip mounted in cavity C1 on die-receiving surface (e.g., surface S2) with solder bumps.

Figure 2:
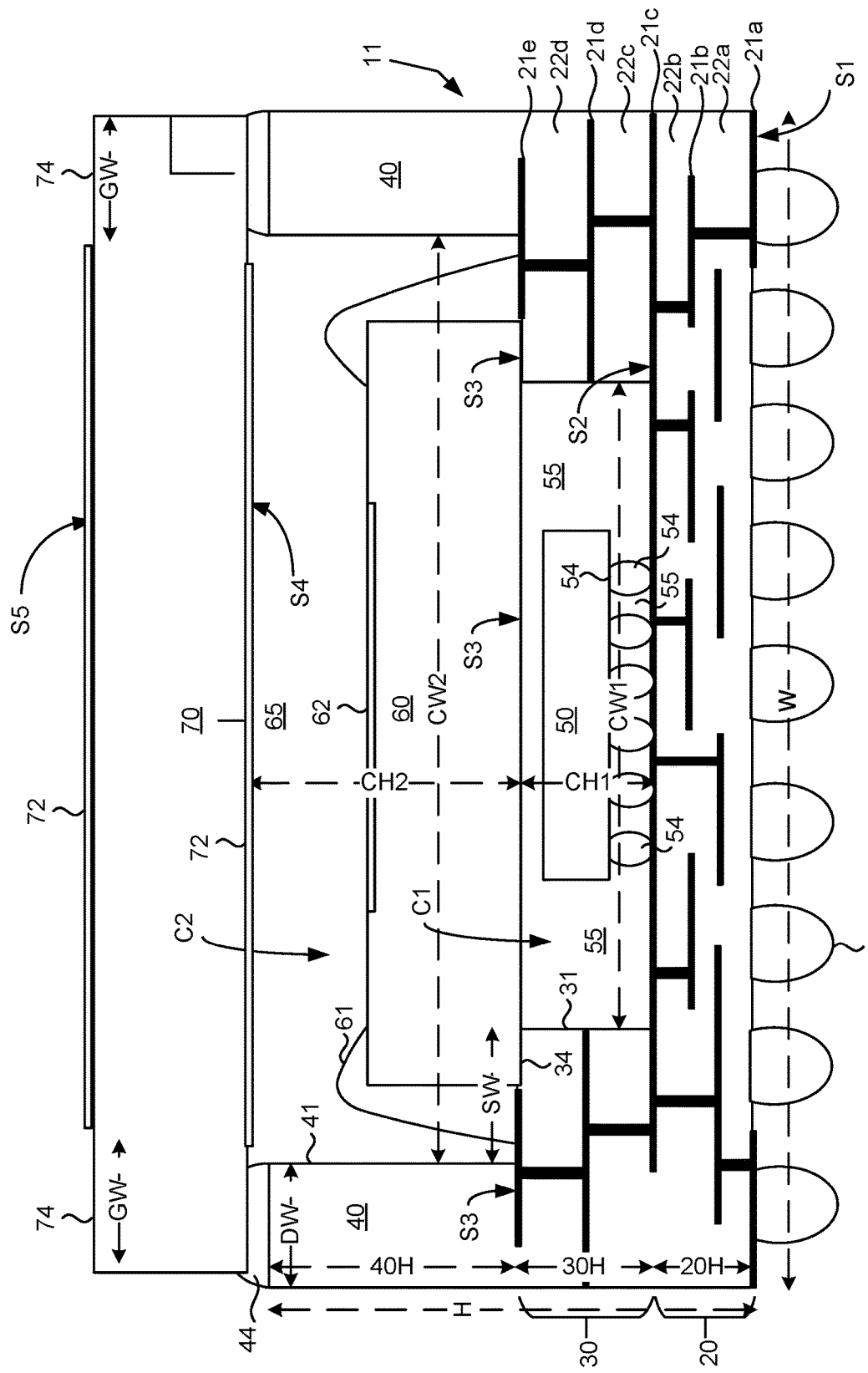
FIG. 2 illustrates another example multi-die image sensor package.

FIG. 2 shows an example a multi-die image sensor package 15 which like a multi-die image sensor package 10 (FIG. 1B) includes ASIC 50 and CIS 60 disposed in cavities C1 and C2 in substrate 11. In multi-die image sensor package 15, ASIC 50 is flip-chip mounted in cavity C1 on die-receiving die surface S2 using solder bumps 54. An encapsulant (e.g., epoxy 55), which may fill cavity C1 up to surface S3 (e.g., up to cavity height CH1) to encapsulate ASIC 50 in cavity C1, may also be used as underfill material flowing into the gaps between the ASIC 50 and surface S2 to reinforce the solder bump interconnects (solder bumps 54).

Figure 4:
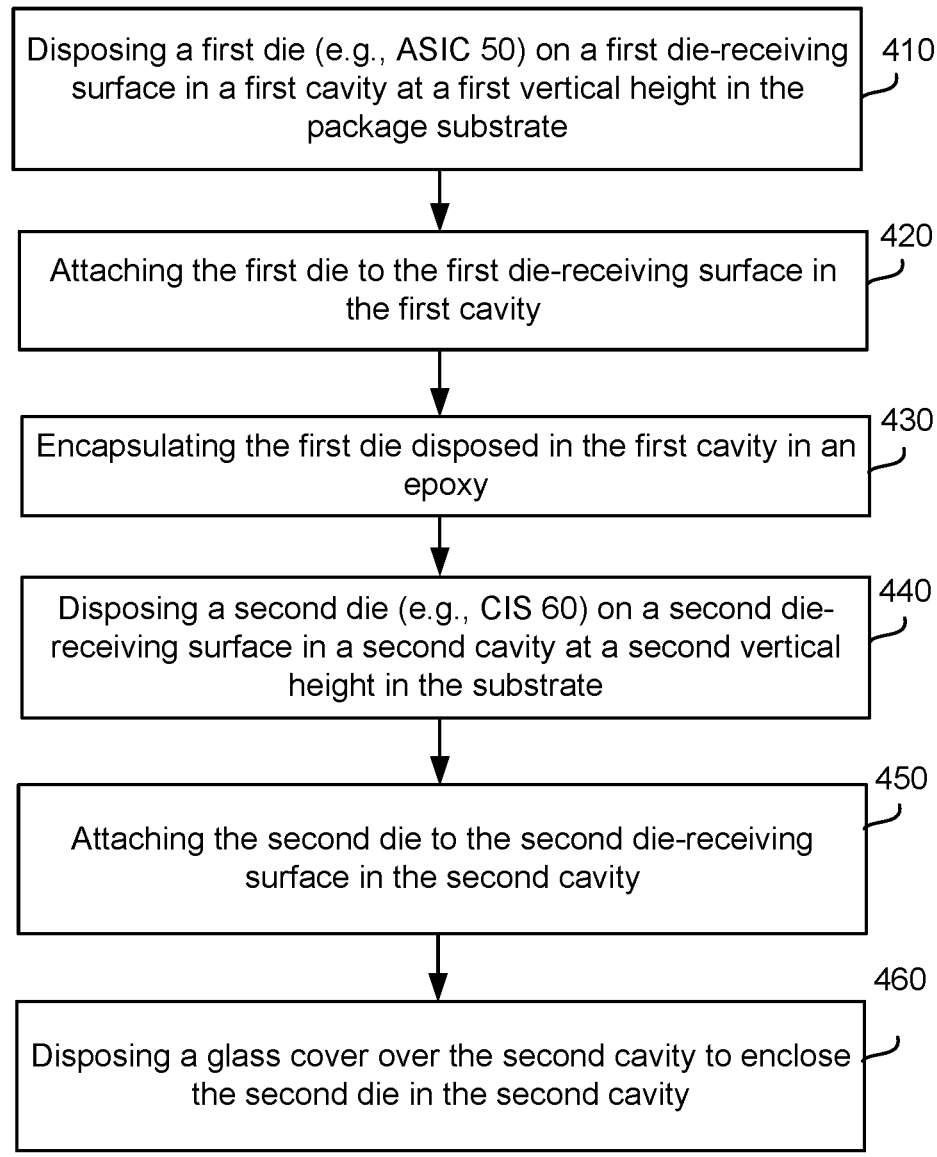
FIG. 4 illustrates an example method for fabricating a multi-die image sensor package.

FIG. 4 shows an example method 400 for fabricating a multi-die image sensor package (e.g., multi-die image sensor package 10, FIG. 1B).

Multi-die image sensor package 10 (as shown in FIG. 1B) may include a plurality of die (e.g., CIS 60, ASIC 50, etc.) disposed during construction of the package in cavities formed at different levels or vertical heights in a package substrate (e.g., substrate 11). The package substrate may, for example, be a multi-layer substrate made, for example, of a stack of dielectric insulating material layers (e.g., layers of ceramic material, flame retardant epoxies (e.g., FR4 or FR5), bismaleimide triazine (BT) epoxy, molding compounds, etc.) interleaved with conductive layers (conductive traces, pads, and planes) for wiring. The package substrate may also include, for example, also include a dam (e.g., dam 40) with a vertical wall height 40H on outer edges of the stack of dielectric insulating material layers.

Method 400 may include disposing a first die (e.g., ASIC 50) on a first die-receiving surface in a first cavity at a first vertical height in the package substrate (410), attaching the first die to the first die-receiving surface in the first cavity (420), and encapsulating the first die disposed in the first cavity in an epoxy (430). Method 400 further includes disposing a second die (e.g., CIS 60) on a second die-receiving surface in a second cavity at a second vertical height in the substrate (440), attaching the second die to the second die-receiving surface in the second cavity die bonding (450), and disposing a glass cover over the second cavity to enclose the second die in the second cavity (460).

In example implementations, in method 400, attaching the first die to the first die-receiving surface in the first cavity 420 may include surface mounting (i.e., die bonding and wire bonding) the first die (e.g., ASIC 50) disposed in the first cavity. In some other example implementations, attaching the first die to the first die-receiving surface in the first cavity 420 may include flip-chip mounting the first die (e.g., ASIC 50) in cavity C1 on the first die-receiving die surface using solder bumps.

Further, in method 400, attaching the second die to the second die-receiving surface in the second cavity 450 may include die bonding and wire bonding the second die (e.g., CIS 60) placed on the second die receiving surface in the second cavity.

FIGS. 5A through 5E show cross-sectional views of a multi-die image sensor package (e.g., multi-die image sensor package 10, FIG. 1B) at different stages of construction on a substrate (e.g., substrate 11), or after the different steps of method 400 for fabricating a multi-die image sensor package.

Figure 5A:
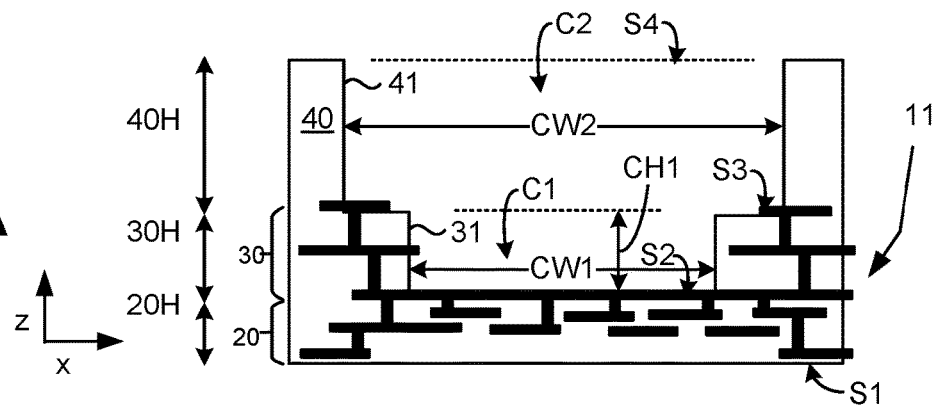
FIGS. 5A through 5E illustrate cross-sectional views of a multi-die image sensor package at different stages of construction.

FIG. 5A shows an example package substrate (e.g., substrate 11, FIG. 1B) that can be used for fabricating the multi-die image sensor package at a first stage of construction (e.g., in method 400, before step 410). As described previously substrate 11 may be a multi-layer substrate made, for example, of a stack of dielectric insulating material layers interleaved with conductive layers for electrical connections to the dies in the package. Substrate 11 may, for example, include a substrate layer stack 20 (of vertical height 20H between bottom surface S1 and surface S2), and a substrate layer stack 30 (of vertical height 30H between surface S2 and surface S3). Further, substrate 11 may include a dam (dam 40) built on edges of a top surface S3 of substrate layer stack 30. Dam 40 may have a vertical height 40H between, for example, surface S3 and surface S4. Substrate 11 may include a first cavity C1 formed as a hole in substrate layer stack 30 with a bottom at surface S2, and a second cavity C2 surrounded by sidewalls 41 of dam 40 and having a bottom at surface S3. First cavity C1 may have a generally rectangular shape with a width CW1 along bottom surface S2 and a height CH1 along sidewalls 31. Second cavity C2 also may have a rectangular shape with a width CW2 along bottom surface S3 and a height CH2 along sidewalls 41 of dam 40. Width CW2 of second cavity C2 may be at least the same as, or greater than width CW1 of first cavity C1.

Figure 5B:
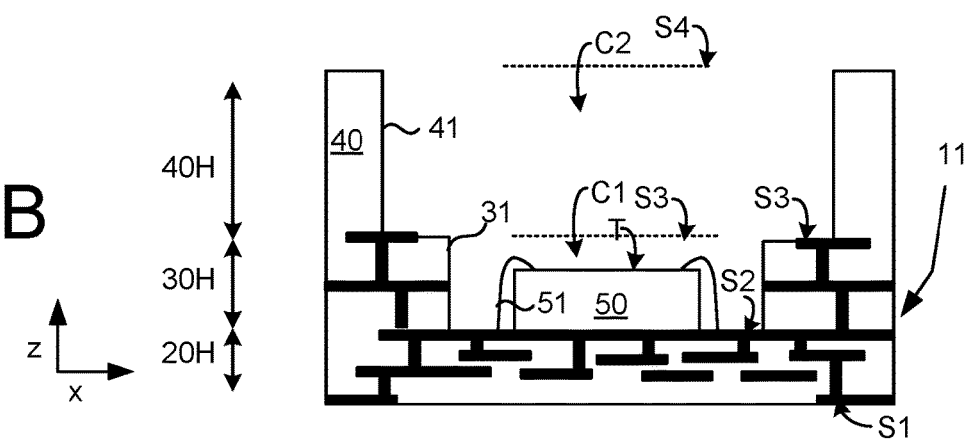

FIG. 5B shows the multi-die image sensor package at a second stage of construction (e.g., after method 400, steps 410-420) with an integrated circuit die (e.g., ASIC 50) placed on, and bonded to, a die-receiving surface (e.g., surface S2) in cavity C1. The IC die (e.g., ASIC 50) may be oriented with so that its backside (B) is bonded to surface S2. The IC die (e.g., ASIC 50) may be bonded to surface S2 using an adhesive (not shown). Further, the IC die may be wire bonded with wires (e.g., wire 51) electrically connecting conductive pads (e.g., Al pads) (not shown) on a top side (T) of the IC die to traces or conductive pads in surface S2.

Figure 5C:
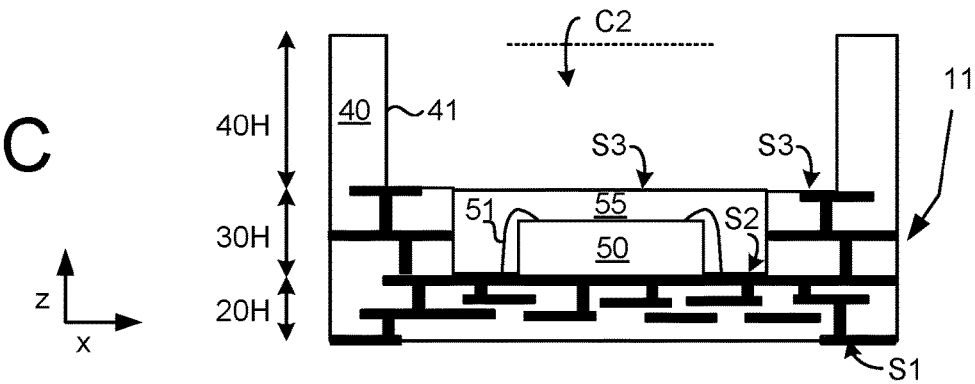

FIG. 5C shows the multi-die image sensor package at a third stage of construction (e.g., after method 400, step 430) in which the die-bonded and wire bonded IC die (e.g., ASIC 50) is encapsulated in cavity C1 by an encapsulant 55 (e.g., an epoxy). Encapsulant 55 (e.g., an epoxy) may fill up cavity C1 up to surface S3 forming a bottom surface of cavity C2. Encapsulant 55 may be cured in situ at the third stage of construction or may be cured in later stages of construction (e.g., at the fourth stage).

Figure 5D:
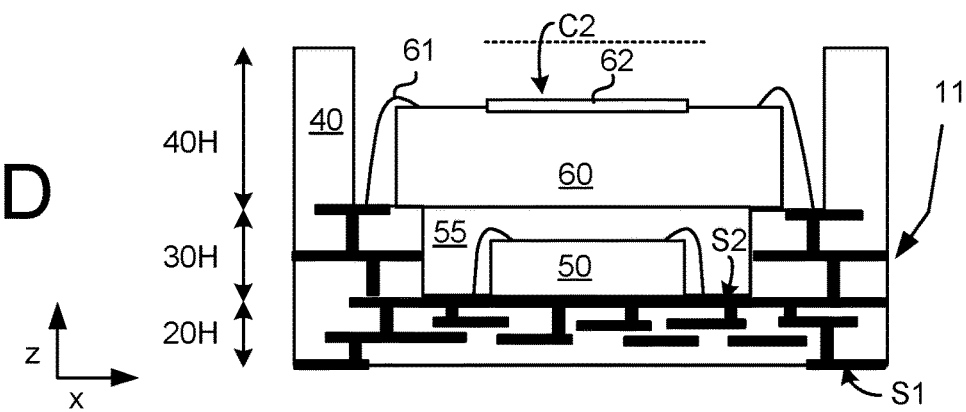

FIG. 5D shows the multi-die image sensor package at a fourth stage of construction (e.g., after method 400, steps 440-450) with a second die (e.g., CIS 60) and bonded to, a die-receiving surface (e.g., surface S3) in cavity C2. CIS 60 may be positioned or oriented so that micro lens or filter assembly (e.g., assembly 62) on CIS 60 is facing upward (in the z direction). CIS 60 may be bonded to the substrate (i.e., surface S3) using, for example, a layer of die bonding adhesive or epoxy (not shown) disposed on surface S3. In some example implementations, uncured epoxy 55 (which fills cavity C1 up to surface S3) may be used to bond CIS 60 to the substrate (after curing). Further, CIS 60 may be wire bonded with wires (e.g., wire 61) electrically connecting conductive pads (e.g., Al pads) (not shown) on CIS 60 to traces or conductive pads in surface S3.

Figure 5E:
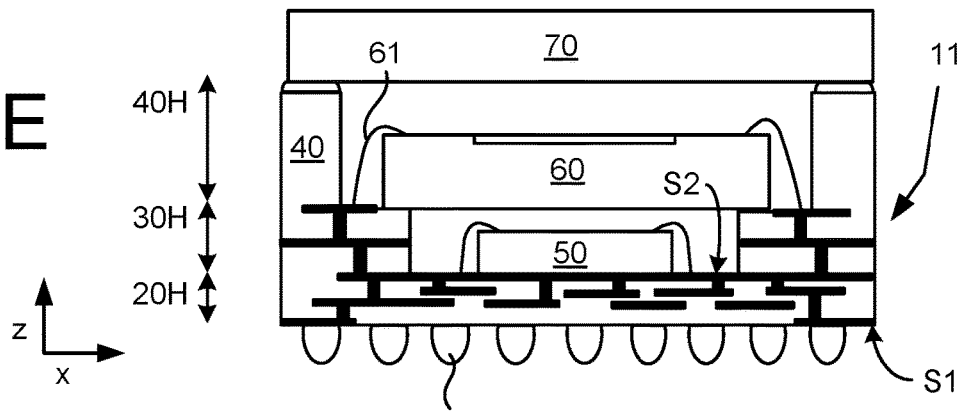

FIG. 5E shows the multi-die image sensor package at a fifth stage of construction (e.g., after method 400, step 460) with glass cover 70 placed on top of the walls of dam 40. Glass cover 70, which encloses cavity C2 from above, may be attached to the top of the walls of dam 40 using an adhesive (e.g., epoxy 44). In the example shown in FIG. 5E, glass cover 70 may be a bare piece of glass without any anti-reflective coating. In some example implementations (as shown for example in FIGS. 1 and 2) glass cover 70 may include anti-reflective coatings (e.g., BBAR 72, FIGS. 1 and 2) covering all or portions of its surfaces. Further, in the fifth stage of construction, solder bumps 80 are attached to bottom surface S1 for input-output (10) connections of the multi-die image sensor package.

In the foregoing example, the IC die (e.g., ASIC 50) is surface mounted in cavity C1 with its backside bonded to surface S2 and its top side facing cavity C2 in the z direction. As previously noted, in some example implementations of the multi-die image sensor package, the IC die (e.g., ASIC 50) may be flip-chip mounted in cavity C1 (e.g., multi-die image sensor package 15, FIG. 2). The methods and stages of construction of multi-die image sensor package 15, FIG. 2, can be generally the same as the methods and stages of construction of the multi-die image sensor package (i.e., package 10, FIG. 1B) discussed above (with reference to FIG. 5A-5E) except for those involving the placement and encapsulation of a flip-chip mounted die in cavity C1.

Figure 6A:
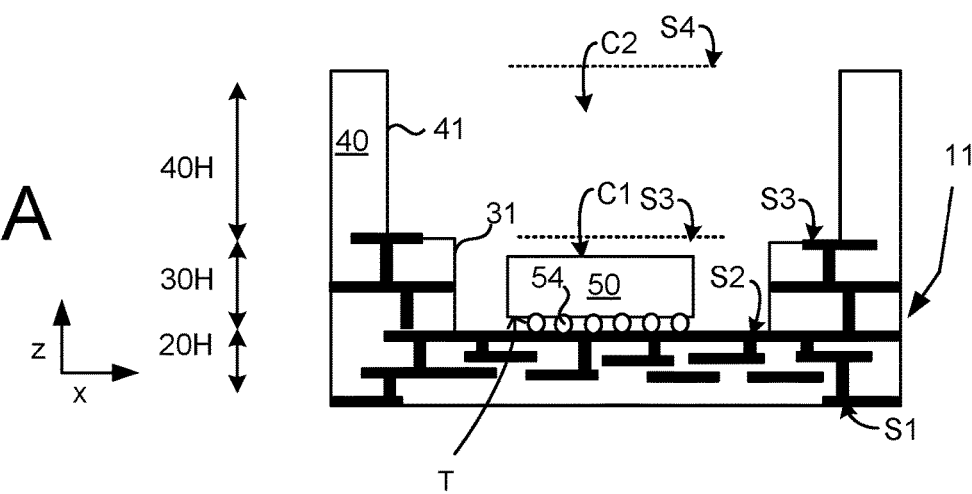
FIGS. 6A and 6B illustrate cross-sectional views of another multi-die image sensor package at different stages of construction.
Figure 6B:
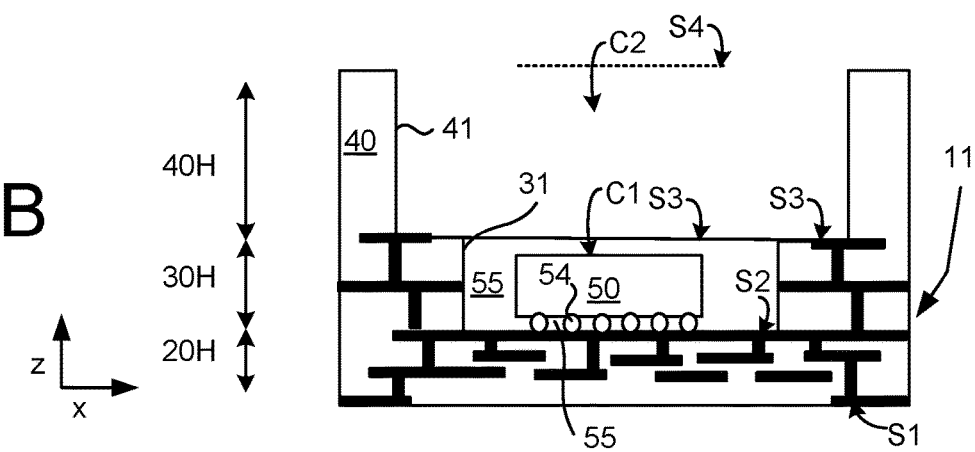

FIGS. 6A and 6B show cross-sectional views of a multi-die image sensor package (e.g., multi-die image sensor package 15, FIG. 2) at the stages of construction involving placement and encapsulation of a flip-chip mounted die (e.g., ASIC 50) in cavity C1 in substrate 11.

FIG. 6A shows the multi-die image sensor package 15 at a stage of construction (e.g., after method 400, steps 410-420) with an IC die (e.g., ASIC 50) that is flip-chip mounted on a die-receiving surface (e.g., surface S2) in cavity C1 of substrate 11. The IC die (e.g., ASIC 50) may have been prepared for flip-chip mounting by depositing a metal redistribution layer (RDL) (not shown) on a top side (T) of the die and attaching solder bumps 54 to the RDL layer. The IC die (e.g., ASIC 50) may be bonded to surface S2 by reflow of solder bumps 54. Further, the IC die may be electrically connected to traces or conductive pads in surface S2 via the solder bumps 54.

FIG. 6B shows the multi-die image sensor package 15 at a next stage of construction (e.g., after method 400, step 430) with the flip-chip mounted IC die (e.g., ASIC 50) encapsulated in cavity C1 by an encapsulant 55 (e.g., an epoxy). Encapsulant 55 (e.g., an epoxy) may fill up cavity C1 up to surface S3 forming a bottom surface of cavity C2. Encapsulant 55 may also be used as underfill material flowing into the gaps between the solder bumps, ASIC 50, and surface S2 to reinforce the solder bump interconnects (solder bumps 54). As described previously with reference to FIG. 5C, encapsulant 55 may be cured in situ at the third stage of construction or may be cured in later stages of construction.

The later stages of construction the multi-die image sensor package 15 that involve, for example, placement and bonding of CIS 60 in cavity C2 in substrate 11, and placement of glass cover 70 over the top of dams 40 may be similar to those for the non-flip-chip mounted IC die described above (e.g., with reference to FIGS. 5D and 5E). For brevity, these descriptions are not repeated here for flip-chip mounted case.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A package comprising:
   a substrate made of a stack of dielectric insulating material layers interleaved with conductive layers, the substrate including a first cavity at a first vertical height from a bottom surface of the substrate and a second cavity at a second vertical height greater than the first vertical height from the bottom surface of the substrate, wherein a sidewall of the first cavity includes a sub stack of the stack of dielectric insulating material layers interleaved with the conductive layers;
   an integrated circuit die disposed in the first cavity;
   a digital image sensor die disposed in the second cavity; and
   a transparent cover disposed at a top of the substrate over the second cavity.

2. The package of claim 1, wherein the substrate further includes a dam with vertical walls disposed on outer edges of a top surface of the stack of dielectric insulating material layers, and wherein the second cavity is formed by a volume surrounded by the vertical walls of the dam and the top surface of the stack of dielectric insulating material layers.

3. The package of claim 2, wherein the transparent cover disposed at the top of the substrate encloses the second cavity and seals the digital image sensor die disposed in the second cavity in a gaseous atmosphere.

4. The package of claim 3, wherein the digital image sensor die is wire bonded to a trace or conductive pad in the substrate.

5. The package of claim 3, wherein the digital image sensor die includes at least one of a micro lens or filter assembly, and the digital image sensor die is surface mounted in the second cavity with at least one of the micro lens or filter assembly facing toward the transparent cover disposed at the top of the substrate over the second cavity.

6. The package of claim 2, wherein the digital image sensor die is surface mounted and bonded to a die-receiving surface in the second cavity.

7. The package of claim 1, wherein the stack of dielectric insulating material layers includes a first substrate layer stack, and a second substrate layer stack disposed vertically above the first substrate layer stack, and wherein the first cavity is a hole in the second substrate layer stack above the first substrate layer stack.

8. The package of claim 7, wherein the integrated circuit die is surface mounted on a die-receiving surface in the first cavity.

9. The package of claim 8, wherein the integrated circuit die is further wire bonded to a trace or conductive pad in the substrate.

10. The package of claim 9, wherein the integrated circuit die disposed in the first cavity is encapsulated in an encapsulant filling the first cavity.

11. The package of claim 7, wherein the integrated circuit die disposed in the first cavity is flip-chip bonded with solder bumps on a die-receiving surface.

12. The package of claim 11, further comprising:
    an encapsulant filling the first cavity such that the integrated circuit die disposed in the first cavity is encapsulated and wherein the encapsulant further underfills gaps between the solder bumps on the die-receiving surface.

13. The package of claim 1, further comprising:
    a plurality of solder bumps attached to the bottom surface of the substrate for input-output (IO) connections of the package.

14. A package comprising:
a substrate including a first cavity underneath a second cavity, the second cavity having an open top at a top surface of the substrate, the substrate being made of a stack of dielectric insulating material layers interleaved with conductive layers;
an integrated circuit die disposed in the first cavity, wherein a sidewall of the first cavity includes a sub stack of dielectric insulating material layers interleaved with the conductive layers;
a complementary metal-oxide-semiconductor image sensor die disposed in the second cavity; and
a transparent cover disposed on the top surface of the substrate covering the open top of the second cavity.

15. The package of claim 14, wherein the complementary metal-oxide semiconductor image sensor die disposed in the second cavity is wire bonded to a conductive layer of the substrate.

16. The package of claim 14, wherein the complementary metal-oxide semiconductor image sensor die disposed in the second cavity includes a micro lens or filter assembly facing the transparent cover placed on the top surface of the substrate.

17. A method, comprising:
disposing a first die on a first die-receiving surface in a first cavity at a first vertical height in a substrate, wherein a sidewall of the first cavity includes a stack of dielectric insulating material layers interleaved with conductive layers; and
disposing a second die on a second die-receiving surface in a second cavity at a second vertical height in the substrate, the second vertical height being greater than the first vertical height in the substrate, the second cavity having an open top.

18. The method of claim 17, wherein disposing the first die on the first die-receiving surface in the first cavity includes:
die bonding and wire bonding the first die on the first die-receiving surface in the first cavity; and
encapsulating the first die disposed in the first cavity in an encapsulant.

19. The method of claim 17, wherein disposing the first die on the first die-receiving surface in the first cavity includes:
flip-chip mounting the first die on the first die-receiving surface using solder bumps; and
encapsulating the first die disposed in the first cavity with an encapsulant underfilling gaps between the solder bumps.

20. The method of claim 17, wherein disposing the second die on the second die-receiving surface in the second cavity includes:
die bonding and wire bonding the second die on the second die-receiving surface in the second cavity.

21. The method of claim 17, further comprising:
disposing a transparent cover over the second cavity to enclose the second die in the second cavity.

* * * * *